US007704882B2

(12) United States Patent
Lee et al.

(10) Patent No.: US 7,704,882 B2
(45) Date of Patent: Apr. 27, 2010

(54) SEMICONDUCTOR DEVICES USING FINE PATTERNS AND METHODS OF FORMING FINE PATTERNS

(75) Inventors: Jeong-ho Lee, Seoul (KR); Young-hoon Park, Suwon-si (KR); Sang-il Jung, Seoul (KR); Ui-sik Kim, Seongnam-si (KR); Jun-seok Yang, Seongnam-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 12/222,842

(22) Filed: Aug. 18, 2008

(65) Prior Publication Data

US 2009/0087986 A1 Apr. 2, 2009

(30) Foreign Application Priority Data

Sep. 28, 2007 (KR) ..................... 10-2007-0098406

(51) Int. Cl.
*H01L 21/44* (2006.01)

(52) U.S. Cl. ....................... 438/675; 438/674; 438/700; 257/E21.236; 257/E21.039

(58) Field of Classification Search ................. 438/674, 438/675, 687, 696, 700–703; 430/311–317; 257/E21.236, E21.039
See application file for complete search history.

(56) References Cited

U.S. PATENT DOCUMENTS

| | | | | |
|---|---|---|---|---|
| 6,063,688 | A * | 5/2000 | Doyle et al. | 438/424 |
| 6,753,220 | B2 * | 6/2004 | Juengling | 438/253 |
| 2008/0009138 | A1 * | 1/2008 | Lee | 438/703 |
| 2008/0014752 | A1 * | 1/2008 | Cha et al. | 438/700 |

FOREIGN PATENT DOCUMENTS

| | | |
|---|---|---|
| KR | 1998-0005458 | 5/1998 |
| KR | 2003-0049574 | 6/2003 |
| KR | 2003-0052664 | 6/2003 |

* cited by examiner

*Primary Examiner*—Charles D Garber
*Assistant Examiner*—Bryan Junge
(74) *Attorney, Agent, or Firm*—Harness, Dickey & Pierce, PLC

(57) ABSTRACT

Example embodiments may provide fine patterns for semiconductor devices and methods of forming fine patterns for semiconductor devices. Example methods may include forming a spacer pattern on a substrate and/or an insulating layer pattern adjacent to sides of the spacer pattern and/or disposed at the same level as the spacer pattern, forming a pair of recesses exposing sides of the spacer pattern by removing a portion of the insulating layer pattern, and/or filling a conductive material in the recesses.

19 Claims, 15 Drawing Sheets

SEMICONDUCTOR DEVICES USING FINE PATTERNS AND METHODS OF FORMING FINE PATTERNS

PRIORITY STATEMENT

This application claims priority under 35 U.S.C. §119 to Korean Patent Application No. 10-2007-0098406, filed on Sep. 28, 2007 in the Korean Intellectual Property Office, the entire contents of which are incorporated herein by reference.

BACKGROUND

1. Field

Example embodiments may relate to methods of manufacturing a semiconductor device, including, for example, methods of manufacturing fine patterns of a semiconductor device and semiconductor devices having the same.

2. Description of the Related Art

Related art electronic devices may be increasingly compact, light, and integrated. Related art semiconductor devices may include fine patterns in order to achieve higher integration. As an example, for the fine patterns, copper (Cu) or the like, which may have a lower specific resistance, may be used as a material for manufacturing wiring lines in related art semiconductor devices. If forming patterns using copper, a damascene process may be used, in which an insulating layer pattern with engraved wiring line patterns may be formed and/or copper may be filled in the engraved patterns.

SUMMARY

Example embodiments may provide methods of manufacturing fine patterns of a semiconductor device that may overcome resolution limitations of photolithography processes.

Example embodiments may also provide methods of manufacturing fine pitch patterns of a semiconductor device in which engraved fine-pitch patterns may be formed when forming wiring lines using a damascene process.

Example methods of forming fine patterns of a semiconductor device may include forming a spacer pattern on a substrate, forming an insulating layer pattern adjacent to both sides of the spacer pattern and at the same level as the spacer pattern, forming a pair of recesses exposing both sides of the spacer pattern by removing a portion of the insulating layer pattern, and/or filling a conductive material in the recesses.

Forming a spacer pattern and insulating layer pattern may include forming a first insulating layer, forming a first insulating layer pattern, forming an opening portion by removing a portion of the first insulating layer, forming a spacer pattern at a side of the first insulating pattern, forming a second insulating layer covering the first insulating layer pattern and/or the spacer pattern, filling the opening portion, and/or forming a second insulating pattern by removing a portion of the second insulating layer so as to expose top surfaces of the first insulating pattern and/or spacer pattern. Forming the spacer pattern may include forming a buffer layer on the substrate, on which the first insulating layer pattern may be formed and/or removing a portion of the buffer layer such that the spacer pattern may remain only at the side of the first insulating pattern.

Forming recesses may include forming a mask pattern exposing the spacer pattern and/or a portion of the insulating pattern adjacent to both sides of the spacer pattern and/or etching the insulating layer pattern using the mask pattern and/or the spacer pattern as an etching mask.

Filling a conductive material may include forming a conductive layer on the spacer pattern and/or on the insulating layer pattern to substantially fill in the recesses and/or partially removing the conductive layer such that the spacer pattern and/or the insulating layer pattern may be exposed.

Partially removing a conductive layer may be performed using a chemical mechanical polishing (CMP) process or the like, and the conductive layer may be polished to remove a portion of the spacer pattern and a portion of an upper portion of the insulating layer pattern. The conductive material may include, for example, Cu, W, Al, and/or another suitable material.

Each of the pair of recesses may have substantially similar width, and width of the first insulating layer pattern may be approximately a sum of the thickness of the buffer layer and the width of both of the recesses. Width of the opening portion may be approximately a sum of the width of each of the recesses and twice the thickness of the buffer layer.

Each of the pair of recesses may have substantially similar width, and width of the first insulating layer pattern may be approximately three times the thickness of the buffer layer, and width of the opening portion may be approximately five times the thickness of the buffer layer. Width of each of the recesses may be approximately substantially similar to the thickness of the buffer layer.

Example methods of forming fine patterns of a semiconductor device may include forming a first buffer layer on a substrate, forming a first insulating layer on the first buffer layer, forming a first insulating layer pattern, a first buffer layer pattern, and/or an opening portion by removing portions of the first insulating layer and/or the first buffer layer, forming a second buffer layer on the exposed portion of the substrate and/or on the first insulating layer pattern and the first buffer layer pattern, forming a second insulating layer having a portion that may be disposed at approximately the same level as the second buffer layer that may be formed on the first insulating layer pattern on the second buffer layer, forming a second insulating pattern by removing portions of the second insulating layer and the second buffer layer such that a top surface of the first insulating layer pattern may be exposed, and/or a spacer pattern, which may be a portion of the remaining portion of the second buffer layer, between the first insulating layer pattern and the second insulating layer pattern, forming a pair of recesses exposing both sides of the spacer pattern by removing portions of the first insulating pattern and/or the second insulating layer pattern, and/or filling a conductive material in the recesses. The second buffer layer may be formed to have substantially similar thickness to the first buffer layer.

Forming recesses may include forming a mask pattern that partially exposes the spacer pattern and/or portions of the first insulating layer pattern and/or the second insulating layer pattern adjacent to both sides of the spacer pattern and/or etching the first insulating layer pattern and/or the second insulating layer pattern using the mask pattern and/or the spacer pattern as an etching mask.

Filling a conductive material may include forming a conductive layer on the spacer pattern, the first insulating layer pattern, and/or the second insulating layer pattern to substantially fill in the recesses and/or removing portions of the conductive layer so as to expose the spacer pattern, the first insulating layer pattern, and/or the second insulating layer pattern.

The conductive material may include, for example, Cu, W, Al, and/or another suitable material. The first insulating layer and/or the second insulating layer may include, for example, an oxide.

Width of the pair of recesses may be substantially similar, and width of the first insulating layer pattern may be approximately a sum of the thickness of the second buffer layer and approximately twice the width of the recess. Width of the opening portion may be a sum of the width of each of the recesses and twice the thickness of the second buffer layer. Each of the pair of the recesses may have substantially similar width, and width of the first insulating layer pattern may be approximately three times the thickness of the second buffer layer. Width of the opening portion may be approximately five times the thickness of the second buffer layer, and width of each of the recesses may be the substantially similar to the thickness of the second buffer layer.

Example fine patterns for a semiconductor device may include a semiconductor substrate, a plurality of spacers on the substrate, each of the spacers having substantially equal width, each of the spacers being spaced from one another at a substantially equal interval, each of the spacers formed out of an insulating material and a plurality of conductive lines on the substrate, each of the conductive lines having a width substantially equal to the width of each of the spacers, each of the conductive lines being between two adjacent spacers such that each of the conductive lines is spaced from one another at the substantially equal interval of the spacers.

The fine pattern may further include a buffer layer between the semiconductor substrate and each of the plurality of conductive lines.

BRIEF DESCRIPTION OF THE DRAWINGS

Example embodiments more apparent by describing in detail the attached drawings in which.

DETAILED DESCRIPTION

Figure 1A:
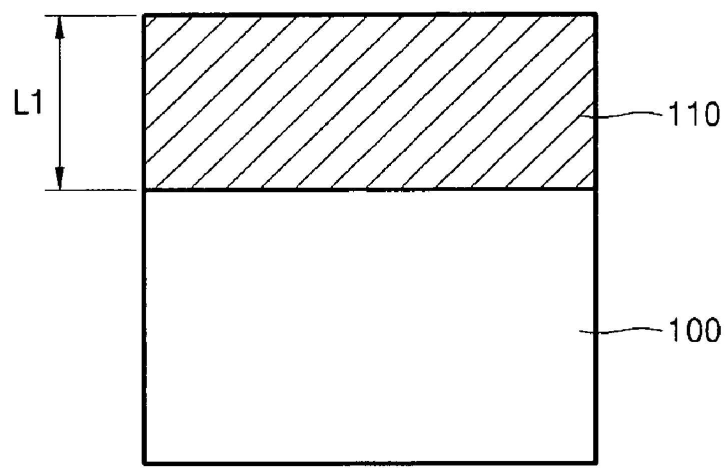
FIGS. 1A through 1J are cross-sectional views illustrating an example method of manufacturing fine patterns of a semiconductor device.

Various example embodiments will now be described more fully with reference to the accompanying drawings. However, specific structural and functional details disclosed herein are merely representative for purposes of describing example embodiments, and one skilled in the art will appreciate that example embodiments may be embodied in many alternate forms and should not be construed as limited to only the example embodiments set forth herein.

It should be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a similar fashion (e.g., "between" versus "directly between", "adjacent" versus "directly adjacent", etc.).

The terminology used herein is for the purpose of describing example embodiments only and is not intended to be limiting of the example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments described below with respect to the drawings are provided so that this disclosure will be thorough, complete and fully convey the concept of example embodiments to those skilled in the art. In the drawings, like numbers refer to like elements throughout. Further, the thicknesses of layers and regions are exaggerated for clarity in the drawings.

The inventors of the current disclosure have recognized that it may be difficult to etch copper in order to form patterns used as conventional wiring lines. The inventors further have recognized that a size of individual semiconductors may be smaller so as to integrate many devices in a smaller space. In order to achieve this integration, a pattern pitch, a sum of the width of all patterns to be formed and/or an interval between the patterns, may be decreased. As design rules of semiconductor devices decrease, the inventors have recognized that an ability to form finer pitches in a photolithography process for forming patterns may be utilized.

The inventors have recognized that if forming finer patterns using copper or the like for highly integrated semiconductor devices, width of spaces between wiring lines may be very small, and it may be more difficult to form an insulating layer pattern having a width corresponding to the spaces between the wiring lines. It may be more difficult to fabricate wiring patterns having smaller widths and finer pitch in, for example, a cell array and circuit patterns having various sizes, as in a peripheral circuit region, as engraved patterns in an insulating layer, at the same time. The inventors have recognized that forming copper patterns using a damascene process art may limit formation of wiring lines for higher integrated semiconductor devices.

FIGS. 1A through 1J are cross-sectional views illustrating an example method of manufacturing fine patterns of an example embodiment semiconductor device.

As shown in FIG. 1A, a first insulating layer 110 may be formed on a substrate 100.

The substrate 100 may be any known semiconductor substrate, such as a silicon substrate, for example. As an example, unit devices (not shown) for forming semiconductor devices, such as transistors, may be formed in the substrate 100, and/or an interlayer insulating layer (not shown) covering the unit devices may be formed on a top surface of the substrate 100. Or, for example, conductive regions (not shown) electrically connected to the unit devices via the interlayer insulating layer may be exposed on the top surface of the substrate 100.

Figure 1B:
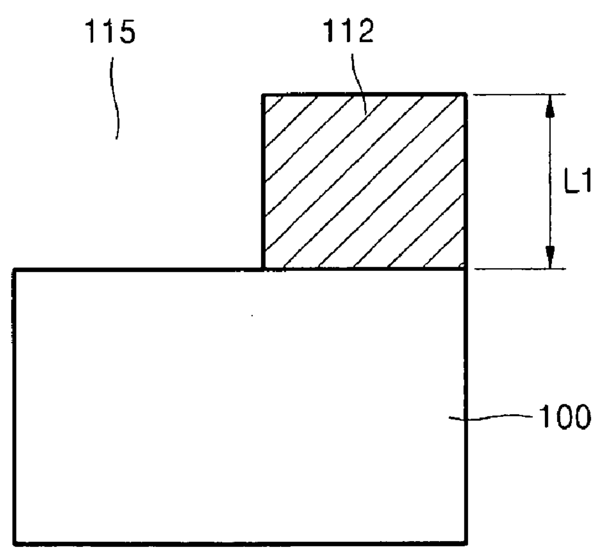
Figure 1C:
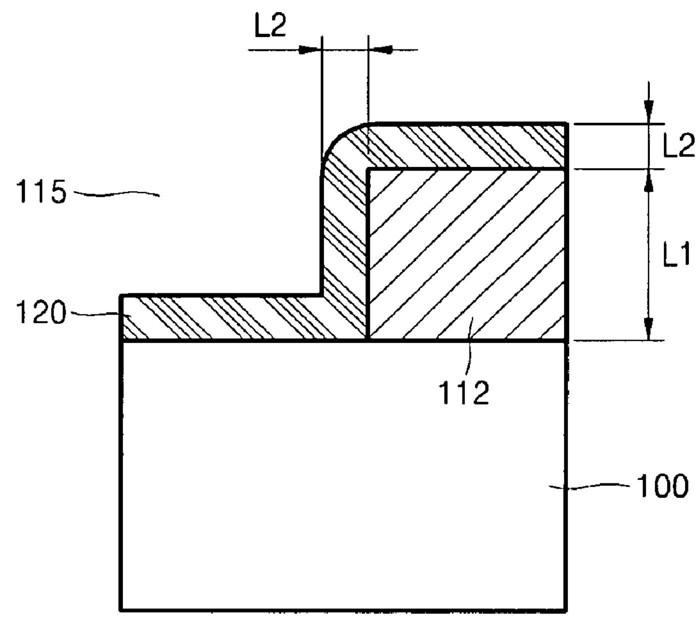
Figure 1D:
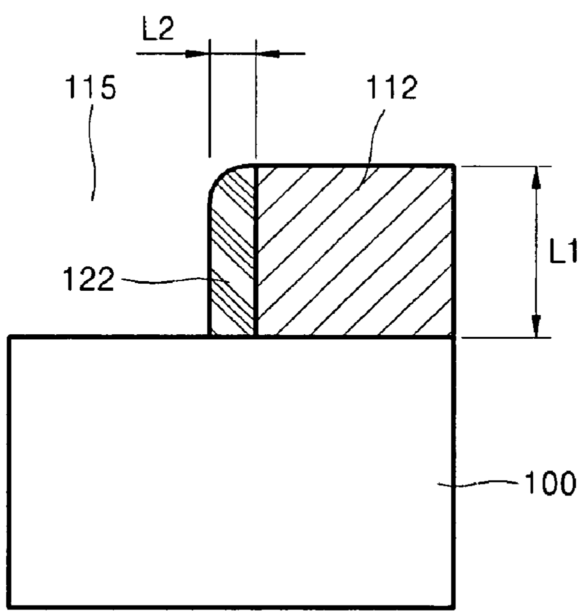
Figure 1E:
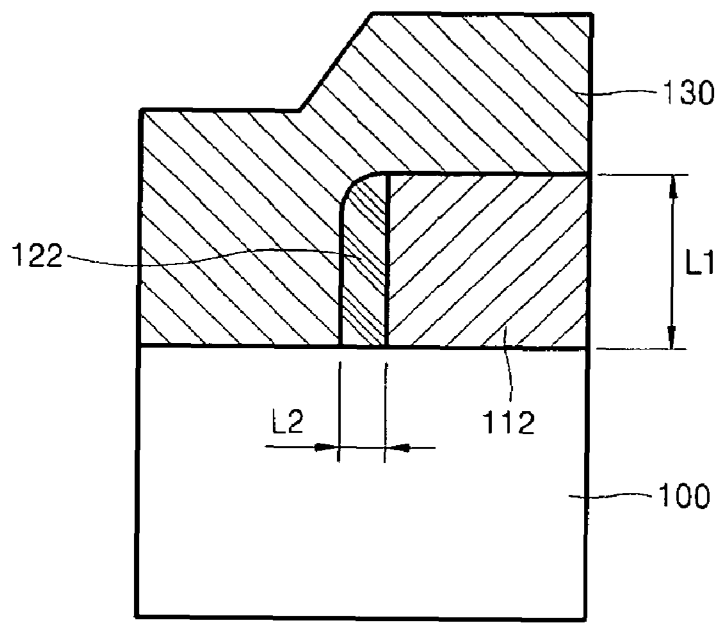
Figure 1F:
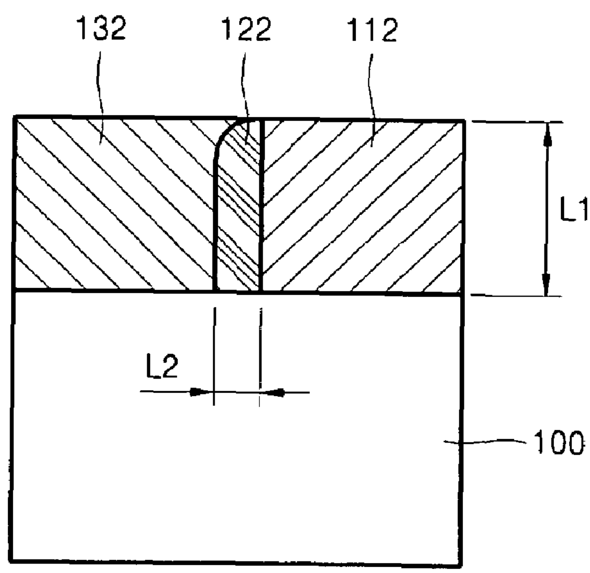
Figure 1G:
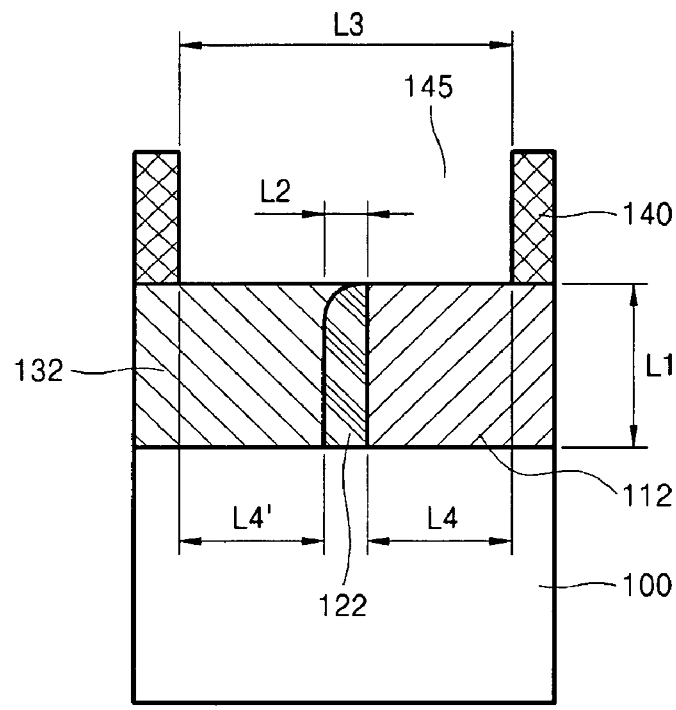
Figure 1H:
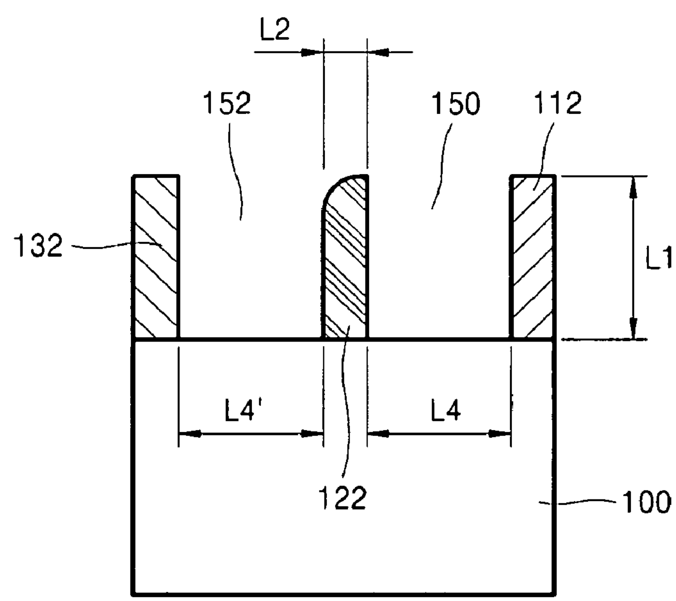
Figure 1I:
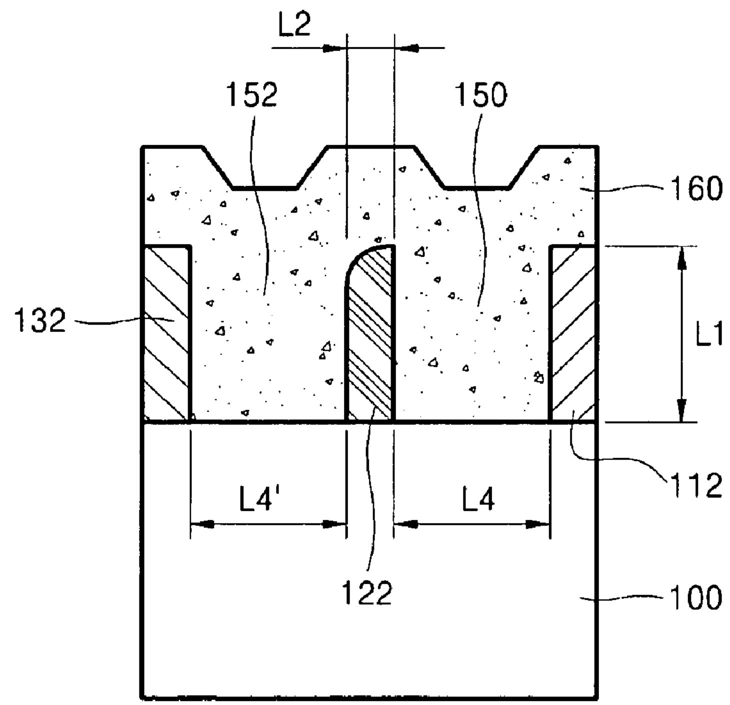
Figure 1J:
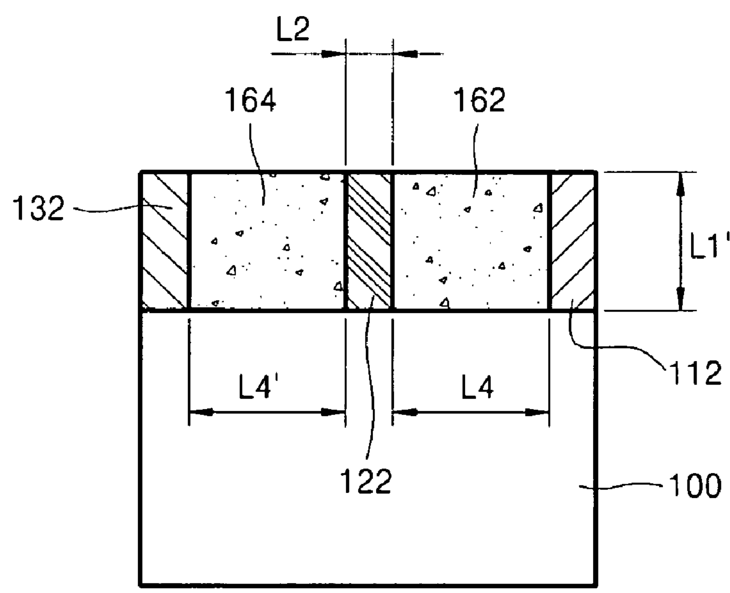

The first insulating layer 110 may be used for electric insulation between conductive patterns 162/164 (FIG. 1J). The first insulating layer 110 will be described in detail later, and may have a greater thickness than the conductive patterns. The first insulating layer 110 may have a first thickness L1, which may be about 5% greater than the thickness of the conductive patterns 162/164 (FIG. 1J). The first insulating layer 110 may be formed of an oxide, a nitride, SiON, an amorphous carbon layer (ACL), SiOC, SiLK, and/or any other suitable material. For example, if the first insulating layer 110 is formed of an oxide, the oxide may be a single oxide layer obtained by a single deposition or may also be a multiple oxide layer obtained by at least two depositions.

As shown in FIGS. 1A and 1B, a portion of the first insulating layer 110 may be removed to form a first insulating pattern 112. An opening 115 exposing the substrate 100 may be formed where the portion of the first insulating layer 110 may be removed. The first insulating pattern 112 may be, for example, a line pattern.

As shown in FIG. 1C, a buffer layer 120 may be formed on the exposed portion of the substrate 100 and/or on the first insulating layer pattern 112. The buffer layer 120 may have a thickness L2 on a lateral and top surface of the first insulating layer pattern 112 and/or on the exposed portion of the substrate 100. The buffer layer 120 may be formed using, for example, an atomic layer deposition (ALD) process. The buffer layer 120 may include an insulating material that may have a different etch selectivity than the first insulating layer pattern 112. The buffer layer 120 may be formed of, for example, an oxide, a nitride, SiON, ACL, SiOC, SiLK, and/or another suitable material. For example, if the first insulating layer pattern 112 is an oxide, the buffer layer 120 may be formed of a nitride.

As shown in FIG. 1D, the buffer layer 120 may be removed except on the lateral surface of the first insulating layer pattern 112 to form a spacer pattern 122. That is, the spacer pattern 122 may be formed by removing the buffer layer 120 on the top surface of the first insulating layer pattern 112 and/or inside the opening portion 115 on the exposed portion of the substrate 100. The buffer layer 120 may be removed by, and spacer pattern 122 may be formed using, for example, an anisotropic etching process such as an etchback process.

As shown in FIG. 1E, a second insulating layer 130 may be formed substantially covering the first insulating layer pattern 112 and/or the spacer pattern 122. The second insulating layer 130 may have a thickness greater than a first thickness L1 of the first insulating layer pattern 112 and may fill the opening portion 115 completely. The two sides of the spacer pattern 122 may be substantially covered by the first insulating layer pattern 112 and the second insulating layer pattern 130. The second insulating layer 130 may be formed of an insulating material that may have a different etch selectivity than the spacer pattern 122. The second insulating layer 130 may be formed of the same insulating material as the first insulating layer pattern 112 and/or an insulating material that may have a similar etch selectivity as the first insulating layer pattern 112. The second insulating layer 130 may be formed of, for example an oxide, a nitride, SiON, ACL, SiOC, SiLK, and/or another suitable material. For example, if the second insulating layer 130 may be formed of a single oxide layer that may be obtained by a single deposition or may also be a multiple oxide layer that may be obtained by at least two depositions. For example, if the first insulating pattern 112 is an oxide, and the spacer pattern 122 is a nitride, the second insulating layer 130 may be formed of an oxide.

As shown in FIG. 1F, a portion of the second insulating layer 130 may be removed so as to expose top surfaces of the spacer pattern 122 and/or the first insulating layer pattern 112 and such that the first insulating pattern 112 and/or the second insulating pattern 132 may be disposed at the same level on both sides of the spacer pattern 122. A planarization process, such as a chemical mechanical polishing (CMP) process, for example, may be used to remove the portion of the second insulating layer 130.

As shown in FIG. 1G, mask patterns 140, for example, photoresist patterns or another suitable mask, may be formed on the first insulating layer pattern 112 and/or the second insulating layer pattern 132 at roughly equal distances from spacer pattern 122, such that portions of the first insulating layer pattern 112, the second insulating layer pattern 132, and/or the spacer pattern 122 may remain exposed. A space 145 between the mask patterns 140 may have a width L3 corresponding to an approximate sum of widths L4 and L4' and a width L2 of the spacer pattern 122. Widths L4 and L4' of the two conductive patterns may be affected by adjusting the width L3 of the space 145 between the mask patterns 140. Although mask patterns 140 are shown at roughly equal distances from spacer pattern 122, widths L4 and L4' may be different according to the desired application.

As shown in FIG. 1H, by using the mask patterns 140 and the spacer pattern 122 as an etching mask, a first recess 150 and a second recess 152 may be formed by removing a portion of the first insulating layer pattern 112 and/or the second insulating layer pattern 132 so as to expose the substrate 100. An etching process with lower etch selectivity with respect to the spacer pattern 122 compared to the first insulating layer pattern 112 and/or the second insulating layer pattern 132 may be used. The spacer pattern 122 may remain between the first recess 150 and/or the second recess 152.

As shown in FIG. 1I, a conductive layer 160 may substantially fill in the first recess 150 and the second recess 152. Conductive layer 160 may cover the first insulating layer pattern 112, the spacer pattern 122, and/or the second insulating layer pattern 132. The conductive layer 160 may be formed of a conductive material including, for example, copper (Cu), tungsten (W), aluminum (Al), and/or another suitable conductor. The conductive layer 160 may be formed by one or more depositions. If the conductive layer 160 is formed by two or more depositions, a seed layer may be formed first. The conductive layer 160 may include at least one barrier layer, based on the desired application and materials used.

As shown in FIG. 1J, a portion of the conductive layer 160 may be removed such that the first insulating layer pattern 112, the spacer pattern 122, and/or the second insulating layer pattern 132 may be exposed to form a first conductive pattern 162 and/or a second conductive pattern 164. Forming the first conductive pattern 162 and/or the second conductive pattern 164 may include removing a portion of top surfaces of the first insulating layer pattern 112, the spacer pattern 122, and/or the second insulating layer pattern 132 together. A second thickness L1', which may be the thickness of the first conductive pattern 162 and/or the second conductive pattern 164, may be smaller than the first thickness L1, which may be the thickness of the first insulating layer pattern 112, the spacer pattern 122, and/or the second insulating layer pattern 132. If the spacer pattern 122 is formed by removing a portion of the buffer layer 120 (of FIG. 1C) using an etchback process, an upper portion of the spacer pattern 122 having a smaller width than a lower portion thereof may be partially removed so as to reduce or substantially eliminate any space between the first conductive pattern 162, the spacer pattern 122, and/or the second conductive pattern 164.

The first conductive pattern 162 and/or the second conductive pattern 164 may be formed using, for example, a planarization process, such as a CMP process, or the like. The first conductive pattern 162 and/or the second conductive pattern 164 may be polished in a CMP process, such that the second thickness L1' may be at least approximately 5% less than the first thickness L1.

FIGS. 2A through 2E are cross-sectional views illustrating a further example method of manufacturing fine patterns of an example embodiment semiconductor device. Example embodiments shown and describes in FIGS. 2A through 2E may possess similar features as those described in FIGS. 1A-1J, whose redundant description may be omitted.

Figure 2A:
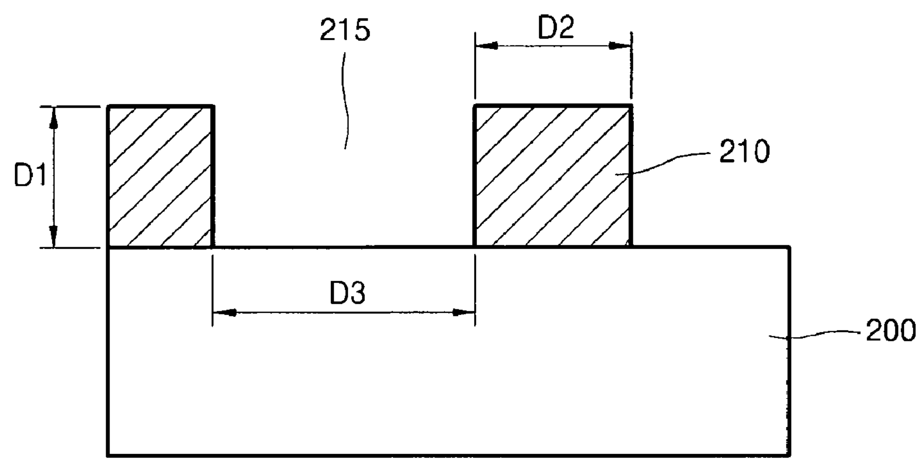
FIGS. 2A through 2E are cross-sectional views illustrating another example method of manufacturing fine patterns of a semiconductor device.

As shown in FIG. 2A, first insulating layer patterns 210 having a first thickness D1 may be formed on a substrate 200. The first insulating layer patterns 210 may be formed from a first insulating layer (not shown) on the substrate 200 by removing a portion of the first insulating layer such that portions of the substrate 200 may be exposed. A width D2 of each of the first insulating patterns 210 and/or a width D3 of an opening portion 215, which may be a space between the first insulating layer patterns 210, may be sized for a desired width of conductive patterns 260 (FIG. 2E) therebetween.

The first insulating layer patterns 210 may be formed such that width D2 thereof may be an approximate sum of widths of the conductive pattern and the width of any spaces between the conductive patterns. Width D3 of the opening portion 215 may be an approximate sum of widths of conductive patterns 260 (FIG. 2E) therein and widths of any spacers formed therein. Repeated patterns in which width of the conductive patterns and spaces of the conductive patterns may be uniform can be formed.

Figure 2B:
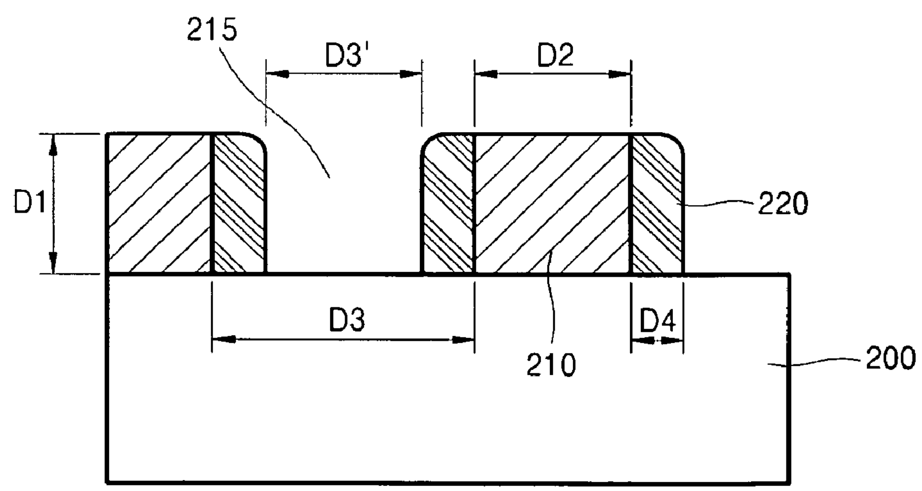
Figure 2C:
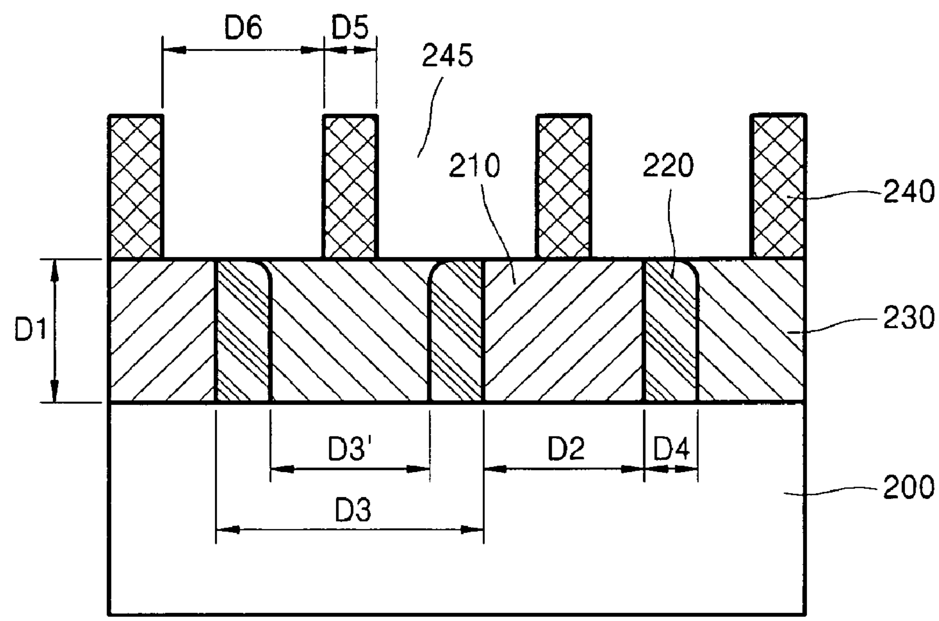
Figure 2D:
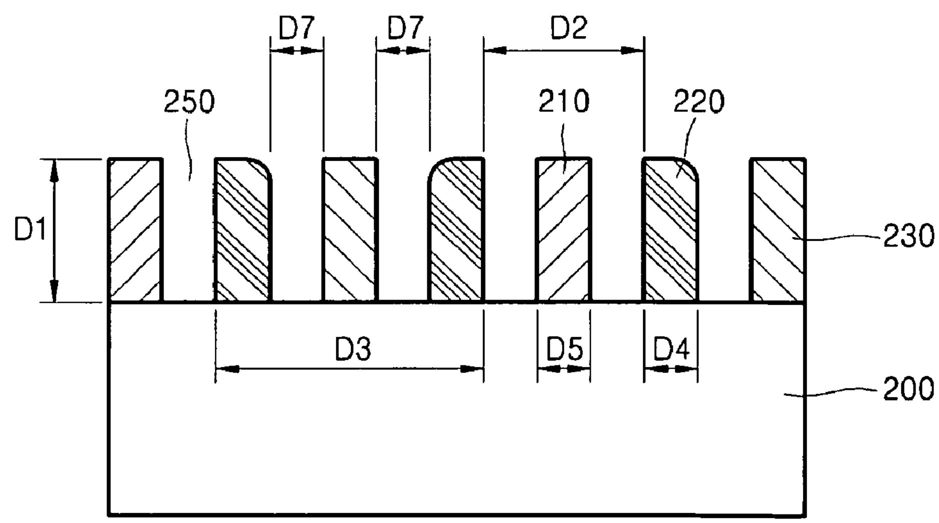
Figure 2E:
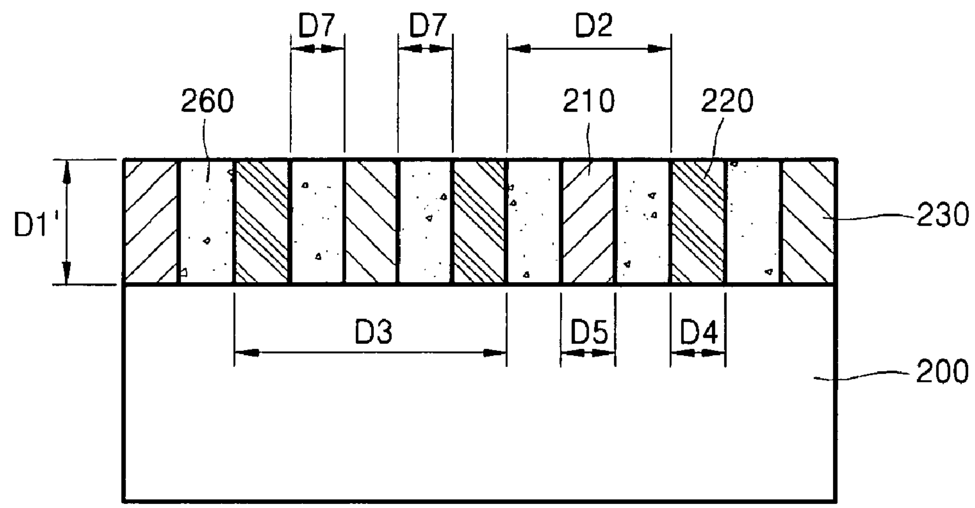

First insulating layer patterns 210 may be formed such that the width D2 is approximately three times the width of the conductive patterns 260 (FIG. 2E). Width D3 of the opening portion 215 may be approximately five times the width of the conductive patterns. Thus, repeated patterns in which the width of the conductive patterns and the spaces of the conductive patterns may be substantially uniform may be formed.

As shown in FIG. 2B, a spacer pattern 220 may be formed on lateral surfaces of the first insulating patterns 210. The spacer pattern 220 may be formed by forming a buffer layer on the substrate 200 on which the first insulating layer patterns 210 are formed and removing a portion of the buffer layer that is formed on a top surface of the first insulating layer pattern 210 and/or on the exposed portion of the substrate 100 inside the opening portion 215. The spacer pattern 220 may be formed using, for example, an anisotropic etching process, such as an etchback process, or the like.

A width D4 of the spacer pattern 220, which may be a thickness of the spacer pattern 220 on the lateral surface of the first insulating layer patterns 210, may be substantially similar to the width of spaces of the conductive patterns. As the spacer pattern 220 is formed, the opening portion 215 may be reduced. The width D3' of the opening portion 215 may be expressed as follows.

$$D3' = D3 - 2*D4$$

If width D4 of the spacer pattern 220 is substantially similar to width of the spacer of the conductive patterns (not yet formed), the width D3' of the opening portion 215 may be substantially similar to width D2 of the first insulating layer pattern 210.

As shown in FIG. 2C, a second insulating pattern 230 may substantially fill opening portion 215. Mask patterns 240, for example, photoresist patterns or the like, may be formed on center portions of the first insulating layer pattern 210 and/or the second insulating layer pattern 230. Width D6 of a space 245 between the mask patterns 240 may be an approximate sum of twice the width of a conductive pattern 260 (FIG. 2E) and width D4 of the spacer pattern 220. The width D6 of the space 245 between the mask patterns 240 may set the width of the conductive patterns formed later. Width D5 of the mask patterns 240 may be substantially similar to width D4 of the spacer patterns 220. If width D2 of the first insulating layer pattern 210 is about three times the width of conductive patterns 260 (FIG. 2E) and width D5 of the mask patterns 240 is substantially equal to the width of the conductive patterns, width of conductive patterns 260 (FIG. 2E) and the width of the spacers of the conductive patterns are uniform can be formed.

As shown in FIG. 2D, by using the mask patterns 240 and/or the spacer patterns 220 as an etching mask, exposed portions of the first insulating layer pattern 210 and the second insulating layer pattern 230 may be removed to expose the substrate 200 so as to form a plurality of recesses 250. An etching process with a lower etch selectivity with respect to the spacer patterns 220 compared to the first insulating layer pattern 210 and the second insulating layer pattern 230 may be used. A width D7 of each of the recesses 250 may determine the width of the conductive patterns 260 (FIG. 2E).

As shown in FIG. 2E, conductive patterns 260 may be formed by filling a conductive material in the recesses 250. The conductive patterns 260 may be formed by filling the recesses 250 with a conductive material and removing a portion of the conductive layer such that the first insulating layer patterns 210, the spacer patterns 220, and the second insulating patterns 230 may be exposed. The conductive layer may be formed of a conductive material including, for example, copper (Cu), tungsten (W), aluminum (Al), and/or another suitable material. If the conductive patterns 260 are formed, portions of top surfaces of the first insulating layer patterns 210, the spacer patterns 220, and/or the second insulating pattern 230 may be removed together. A thickness D1' of the conductive patterns 260 may be less than the first thickness D1 of the first insulating layer patterns 210. Because the spacer patterns 220 may be formed by removing a portion of the buffer layer using an etchback process, a portion of the top surfaces of the spacer patterns 220 not flush with an adjacent conductive pattern 260 may be removed such that the conductive patterns 260 are each substantially insulated.

The conductive patterns 260 may be formed using, for example, a planarization process, such as a CMP process or the like. In the CMP process, the conductive pattern 260 may be polished at least about 5% of the first thickness D1 so that the second thickness D1' may be less than the first thickness D1.

FIGS. 3A through 3I are cross-sectional views illustrating an example method of manufacturing fine patterns of an example embodiment semiconductor device.

Figure 3A:
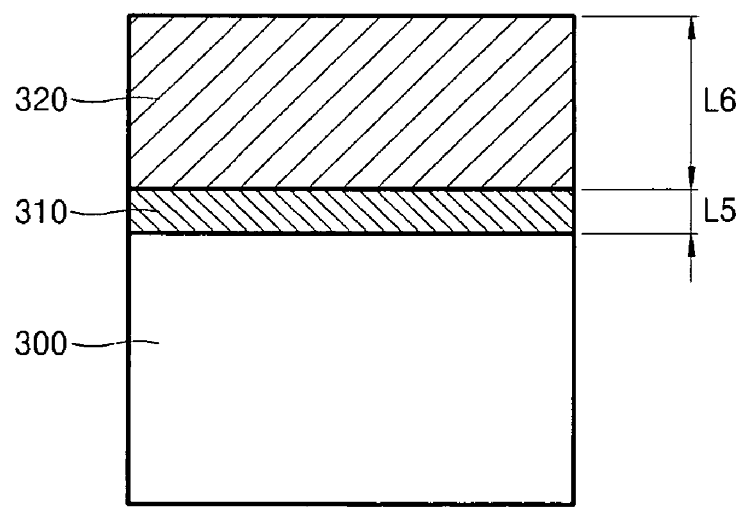
FIGS. 3A through 3I are cross-sectional views illustrating another example method of manufacturing fine patterns of a semiconductor device.

As shown in FIG. 3A, a first buffer layer 310 and/or a first insulating layer 320 may be formed on a substrate 300.

The substrate 300 may be any known semiconductor substrate, such as a silicon substrate, for example. In the substrate 300, unit devices (not shown) used to manufacture semiconductor devices such as transistors may be formed, and an interlayer insulating layer covering the unit devices may be formed on a top surface of the substrate 300. Also, conductive areas (not shown) that may be electrically connected to the unit devices via the interlayer insulating layer may be exposed on the top surface of the substrate 300.

Figure 3B:
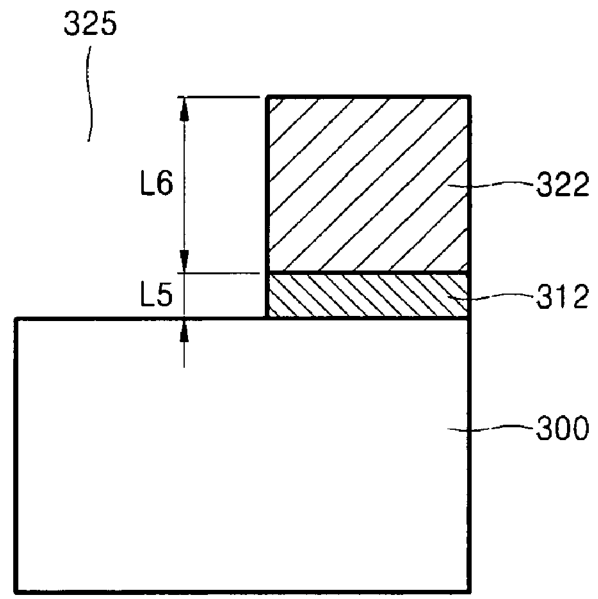
Figure 3C:
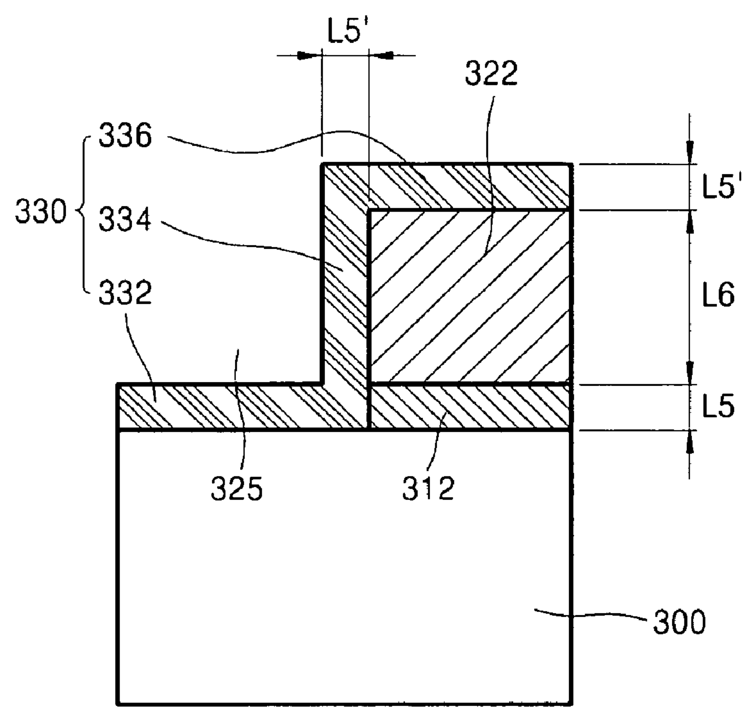
Figure 3D:
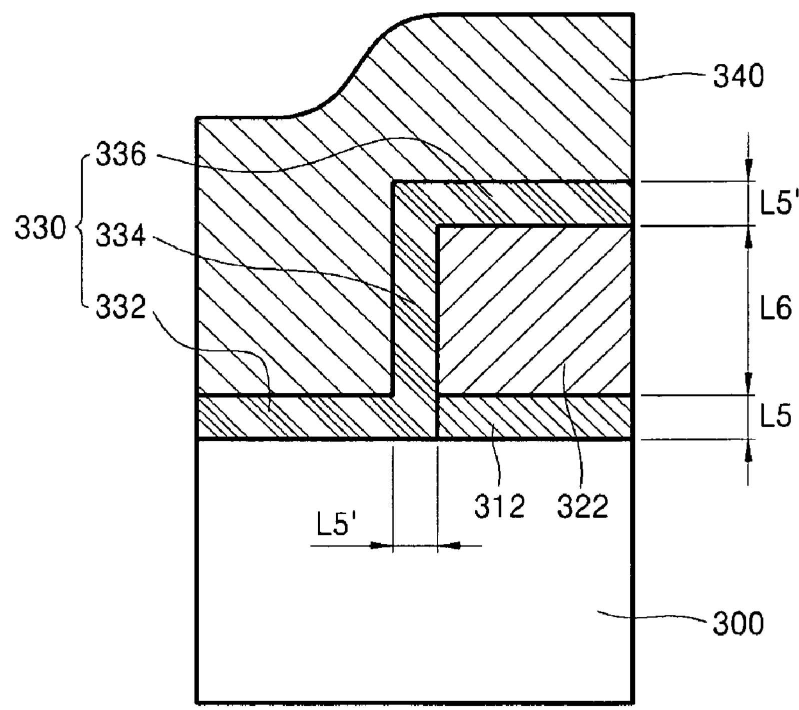
Figure 3E:
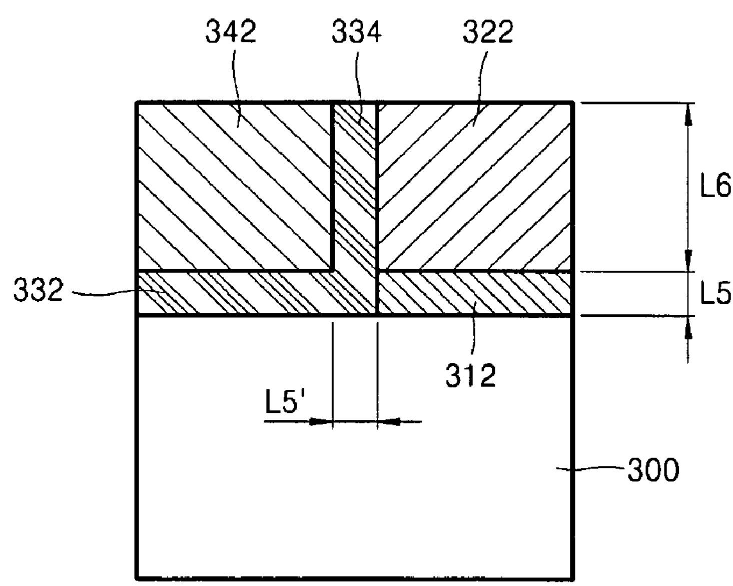
Figure 3F:
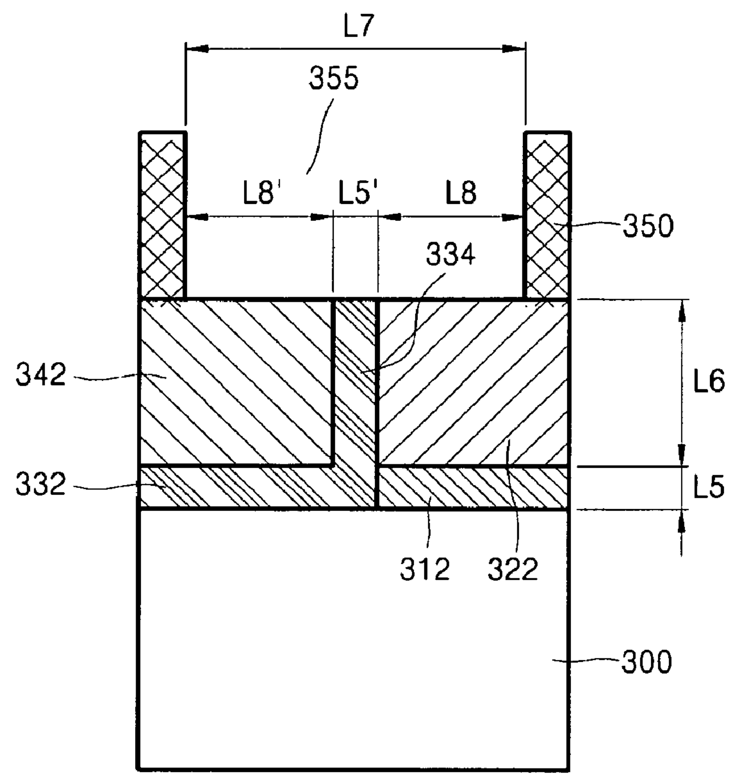
Figure 3G:
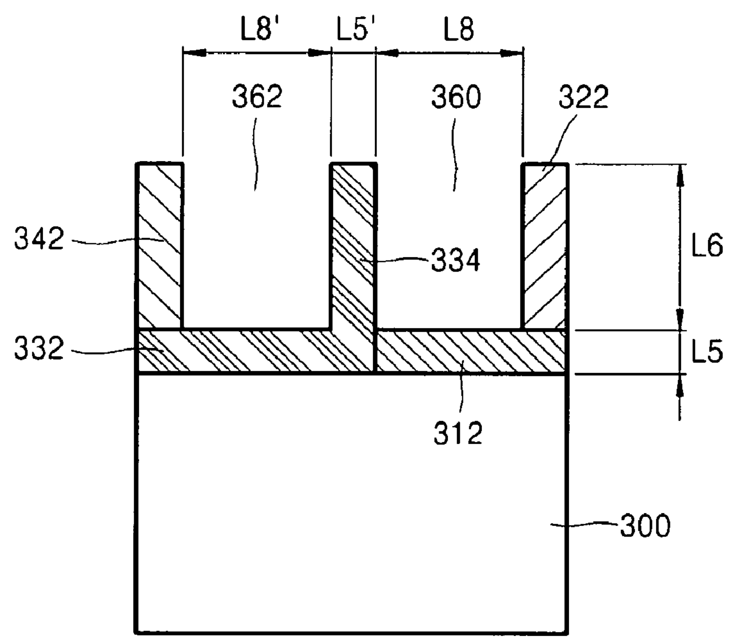
Figure 3H:
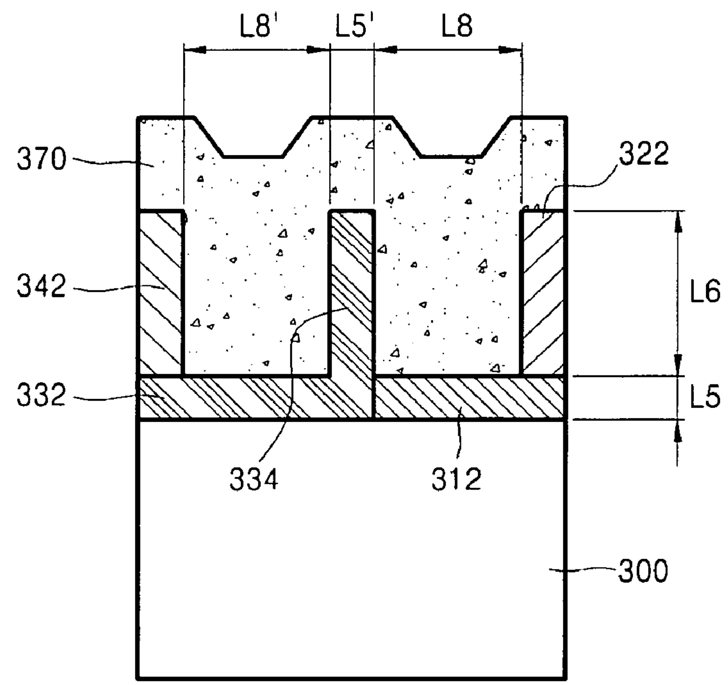
Figure 3I:
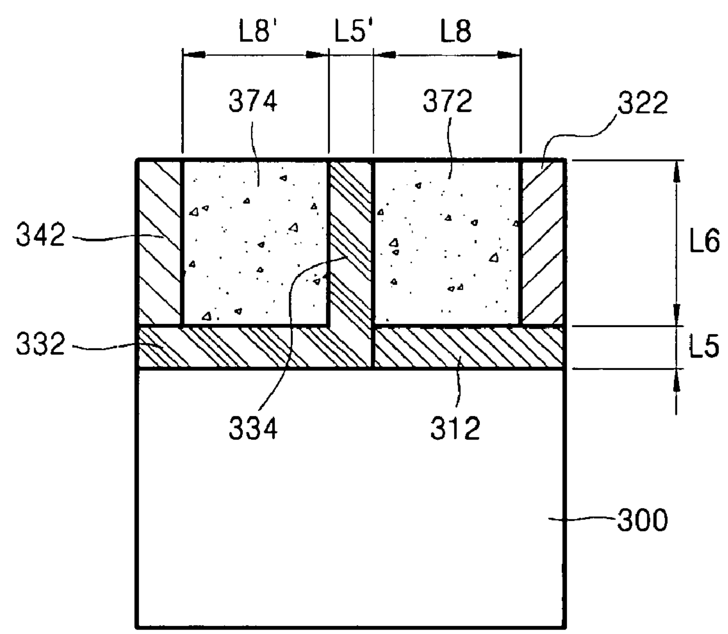

A thickness L5 of the first buffer layer 310 may be substantially similar to a width of a spacer of conductive patterns 372 and 374 (FIG. 3I). The first buffer layer 310 may be formed of an insulating material that may have substantially similar etch selectivity as that of the first insulating layer 320. The first buffer layer 310 may be formed of an oxide, a nitride, SiON, ACL, SiOC, SiLK, and/or another suitable material. For example, if the first insulating layer 320 is an oxide, the first buffer layer 310 may be formed of a nitride.

The first insulating layer 320 may be used for electric insulation between conductive patterns 372 and 374 (FIG. 3I). A thickness L6 of the first insulating layer 320 may be substantially similar to the thickness of the conductive 372 and 374 (FIG. 3I). The first insulating layer 320 may be formed of an oxide, a nitride, SiON, ACL, SiOC, SiLK, and/or another suitable material. For example, the first insulating layer 320 may be a single oxide layer obtained by a single deposition or a multiple oxide layer obtained by at least two depositions.

As shown in FIGS. 3A and 3B, portions of the first buffer layer 310 and the first insulating layer 320 are removed to form a first buffer layer pattern 312 and a first insulating layer pattern 322, and thereby expose a portion of the substrate 300. An opening portion 325 through which the substrate 300 is exposed is formed in the place of the removed portions of the first buffer layer 310 and the first insulating layer 320. The first buffer layer pattern 312 and the first insulating layer pattern 322 may be, for example, line patterns.

As shown in FIG. 3C, a second buffer layer 330 may be on the exposed portion of the substrate 300 on which the first buffer layer pattern 312 and the first insulating layer pattern 322 may be formed. The second buffer layer 330 may be formed on an exposed portion of the substrate 300 and inside the opening portion 325, on a lateral surface of the first buffer layer pattern 312, and/or on a lateral surface and a top surface of the first insulating layer pattern 322. The second buffer layer 330 may have a thickness L5'. The thickness L5' of the second buffer layer 330 may be substantially similar to thickness L5 of the first buffer layer pattern 312. The second buffer layer 330 may be formed from a bottom surface 332 formed on a portion of the substrate 300 exposed in the opening portion 325, a spacer pattern 334 on the lateral surfaces of the first buffer layer pattern 312 and the first insulating layer pattern 322, and/or a top surface 336 formed on the top surface of the first insulating layer pattern 322.

Second buffer layer 330 may be formed using, for example, an atomic layer deposition (ALD) process or the like. The second buffer layer 330 may include an insulating material that may have an etch selectivity different from that of the first insulating layer pattern 312. Second buffer layer 330 may include a similar insulating material as the first buffer layer pattern 312 or an insulating material that may have a similar etch selectivity as the first buffer layer pattern 312. The second buffer layer 330 may be formed of, for example, an oxide, a nitride, SiON, ACL, SiOC, SiLK, and/or another suitable material. For example, if the first insulating layer pattern 322 is an oxide, the second buffer layer 330 may be formed of a nitride.

As shown in FIG. 3D, a second insulating layer 340 may be formed to cover the entire second buffer layer 330. The second insulating layer 340 may substantially fill the opening portion 325. Sides of the spacer pattern 334 may be substantially covered by the first insulating layer pattern 322 and/or the second insulating layer 340. The second insulating layer 340 may have a different etch selectivity than the spacer pattern 334 and may be formed of an insulating material that may have a similar etch selectivity as the first insulating layer pattern 322. Insulating layer 340 may be formed of, for example, an oxide, a nitride, SiON, ACL, SiOC, SiLK, and/or any other suitable material. For example, the second insulating layer 340 may be a single oxide layer obtained by a single deposition or a multiple oxide layer obtained by two or more depositions. As a further example, if the first insulating layer pattern 322 is an oxide and the spacer pattern 334 is a nitride, the second insulating layer 340 may be an oxide.

As shown in FIG. 3E, a second insulating pattern 342 may be formed by removing a portion of the second insulating layer 340 and the top surface 336 of the second buffer layer 330 so as to expose a top surface of the first insulating layer pattern 322. First insulating layer pattern 322 and second insulating layer pattern 342 may have a substantially equal thickness at either side of the spacer pattern 334. Second insulating layer pattern 342 may be formed using, for example, a planarization process, such as a chemical mechanical polishing (CMP) process, or any other known process. Any additional process for forming the spacer pattern 334 may not be desired in example methods described in FIG. 3E.

As shown in FIG. 3F, mask patterns 350 may be formed on the first insulating layer pattern 322 and the second insulating layer pattern 342 such that portions of the first insulating layer pattern 322 and/or the second insulating layer pattern 342 together with the spacer pattern 334 may be exposed. A width L7 of a space 355 between the mask patterns 350 may be an approximate sum of two widths L8 and L8' of conductive patterns (not yet formed) and width L5' of the spacer pattern 334. Width L7 of the space 355 between the mask patterns 350 may affect the two widths L8 and L8' of conductive patterns 372 and 374 (FIG. 3I). Widths L8 and L8' of the conductive patterns may be substantially similar or different based on the desired application.

As shown in FIG. 3G, by using the mask patterns 350 and/or the spacer pattern 334 as an etching mask, a first recess 360 and/or a second recess 362 may be formed by removing exposed portions of the first insulating layer pattern 322 and/or the second insulating layer pattern 342. An etching process with a lower etch selectivity with respect to the spacer pattern 334 than that for the first insulating layer pattern 322 and/or the second insulating layer pattern 342 may be used. Spacer pattern 334 may remain between the first recess 360 and the second recess 362.

As shown in FIG. 3H, a conductive layer 370 may substantially fill the first recess 360 and/or the second recess 362. The conductive layer 370 may cover first insulating layer pattern 322, the spacer pattern 334, and/or the second insulating layer pattern 332. The conductive layer 370 may be formed of a conductive material including, for example, copper (Cu), tungsten (W), aluminum (Al), and/or any other suitable conductor. The conductive layer 370 may be formed by a single deposition or by several depositions. If the conductive layer 370 is formed by two or more depositions, a seed layer may be formed first. Also, the conductive layer 370 may include at least one barrier layer.

As shown in FIGS. 3H and 3I, a portion of the conductive layer 370 may be removed such that the first insulating layer pattern 322, the spacer pattern 334, and/or the second insulating layer pattern 342 may be exposed so as to form a first conductive pattern 372 and/or a second conductive pattern 374. In example methods, while forming the first conductive pattern 372 and the second conductive pattern 374, widths of lower and upper portions of the spacer pattern 334 may be substantially uniform even when the first insulating pattern 322, the spacer pattern 334, and/or an upper portion of the second insulating layer pattern 342 are not removed together. Any space between the first conductive pattern 372 and the second conductive pattern 374 may be insulated completely. The conductive pattern 372 and/or the second conductive pattern 374 may be formed, for example, using a planarization process, such as a CMP process, or the like.

FIGS. 4A through 4E are cross-sectional views illustrating an example method of manufacturing fine patterns of an example embodiment semiconductor device. Example methods and embodiments described with reference to FIGS. 4A through 4I may possess similar features to previously described embodiments, whose redundant description may be omitted.

Figure 4A:
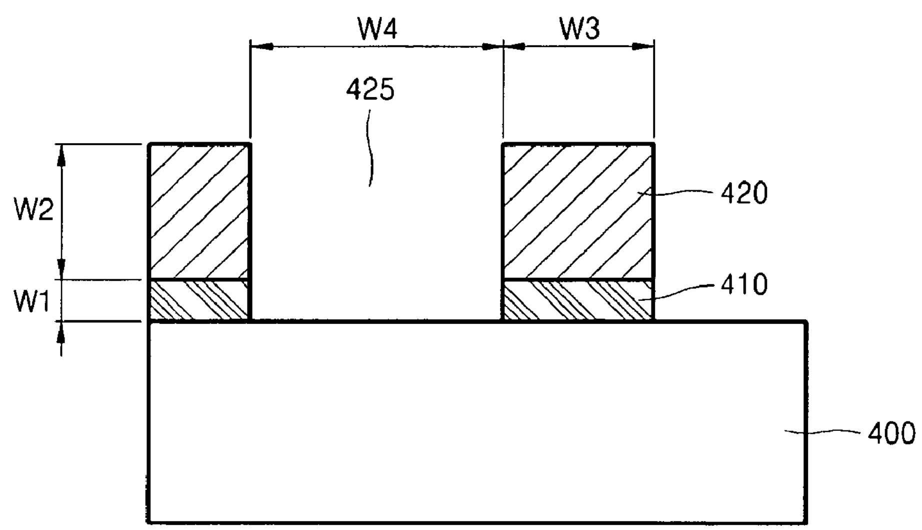
FIGS. 4A through 4E are cross-sectional views illustrating another example method of manufacturing fine patterns of a semiconductor device.

As shown in FIG. 4A, first buffer layer pattern 410 and/or first insulating layer pattern 420 on the first buffer layer pattern 410 may be formed on a substrate 400. A thickness W1 of the first buffer layer pattern 410 may be substantially similar to a width of a spacer of conductive patterns 470 (FIG. 4E). The first insulating layer pattern 420 may have a first thickness W2 substantially similar to a width of the conductive patterns 470 (FIG. 4E). The first buffer layer patterns 410 and the first insulating layer pattern 420 may be formed by forming a first buffer layer (not shown) and/or a first insulating layer (not shown) on the substrate 400 and removing portions of the first buffer layer and/or the first insulating layer so as to expose portions of the substrate 400. The first buffer layer patterns 410 and/or the first insulating layer pattern 420 may be, for example, line patterns. A width W3 of the first insulating layer pattern 420 and a width W4 of an opening portion 425, which may be a space between two first buffer layer patterns 410 may be an approximate sum of a width of the conductive patterns and any space between the conductive patterns.

Width W3 of the first insulating layer pattern 420 may be formed to be an approximate sum of twice the width of the conductive patterns 470 (FIG. 4E) and the width of the space of the conductive patterns. Width W4 of the opening portion 425 may be an approximate sum of the width of the conductive patterns 470 (FIG. 4E) and twice the width of any spacer of the conductive patterns.

Width W3 of the first insulating layer patterns 420 may be approximately three times the width of the conductive patterns 470 (FIG. 4E). Width W4 of the opening portion 425 may be about five times the width of the conductive patterns 470 (FIG. 4E). Repeated patterns may be formed, in which the width of the conductive patterns and the spacers of the conductive patterns may be uniform.

Figure 4B:
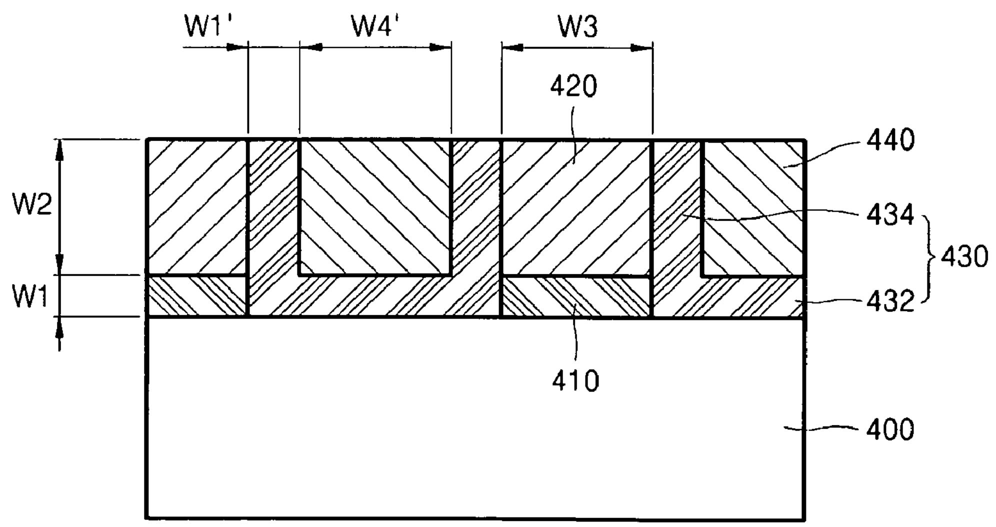

As shown in FIGS. 4A and 4B, second buffer layer pattern 430 may be formed on a portion of the substrate 400 exposed in the opening portion 425, at sides of the first insulating layer pattern 420, and/or the first buffer layer patterns 410. Second insulating layer patterns 440 may be formed in a space between the second buffer layer patterns 430. Second buffer layer pattern 430 may include a second buffer layer bottom surface 432 and/or a spacer pattern 434 at the sides of the first buffer layer pattern 410 and/or first insulating layer pattern 420. A thickness W1' of the second buffer layer patterns 430, which may be width W1' of the spacer patterns 434, may have substantially the same as the thickness W1 of the first buffer layer pattern 420.

In order to form the second buffer layer pattern 430 and/or the second insulating layer pattern 440, a second buffer layer (not shown) may be formed on the substrate 400, on which the first buffer layer patterns 410 and the first insulating layer pattern 420 are formed. A second insulating layer (not shown) may be formed on the second buffer layer to substantially fill the opening portion 425. Portions of the second insulating layer and the second buffer layer may be removed so as to expose a top surface of the first buffer layer pattern 420 and so as to form second buffer layer pattern 430 and/or second layer pattern 440. The second buffer layer pattern 430 and/or the second layer patterns 440 may be formed using, for example, a planarization process, such as a CMP process or the like.

Width W1' of the spacer patterns 434, which may be a thickness of the spacer pattern 434 on a side of the first insulating layer pattern 420, may substantially similar to width of the spacer of conductive patterns 470 (FIG. 4E). A width W4' of the second insulating layer patterns 440 may be expressed as:

$$W4' = W4 - 2*W1'$$

Width W4' of the second insulating layer pattern 440 may be substantially similar to width W3 of the first insulating layer pattern 420. If width W1' of the spacer pattern 434 is substantially similar to the width of the space of the conductive patterns 470 (FIG. 4E), width W4' of the second insulating layer pattern 440 may be substantially similar to the width W3 of the first insulating layer pattern 420.

Figure 4C:
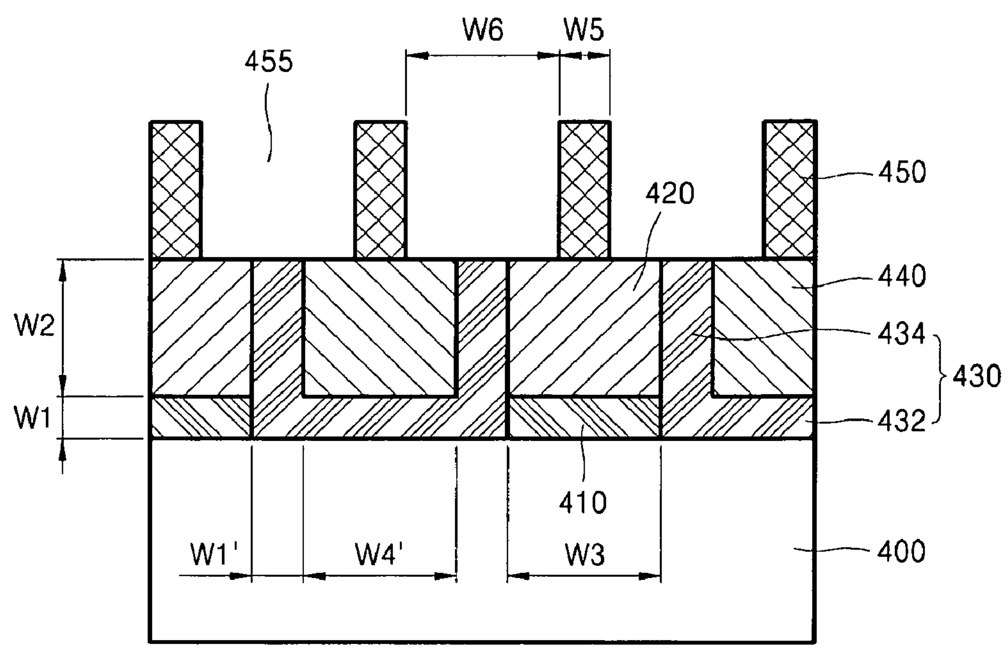

As shown in FIG. 4C, mask patterns 450 may be formed in center portions of first insulating layer patterns 420 and second insulating layer patterns 440. A width W6 of spaces 455 between the mask patterns 450 may be an approximate sum of twice the width of conductive patterns 470 (FIG. 4E) and the width of the spacer patterns 434. The width W6 of the space 455 between the mask patterns 450 may set the width of the conductive patterns 470 (FIG. 4E). A width W5 of the mask patterns 450 may be substantially similar to the width W1' of the spacer pattern 434. If a width W3 of the first insulating layer patterns 420 is about three times the width of the conductive patterns 470 (FIG. 4E), and the width W5 of the mask patterns 450 is substantially similar to the width of the conductive patterns, the width of the conductive patterns and/or the spacer of the conductive patterns may be uniform.

Figure 4D:
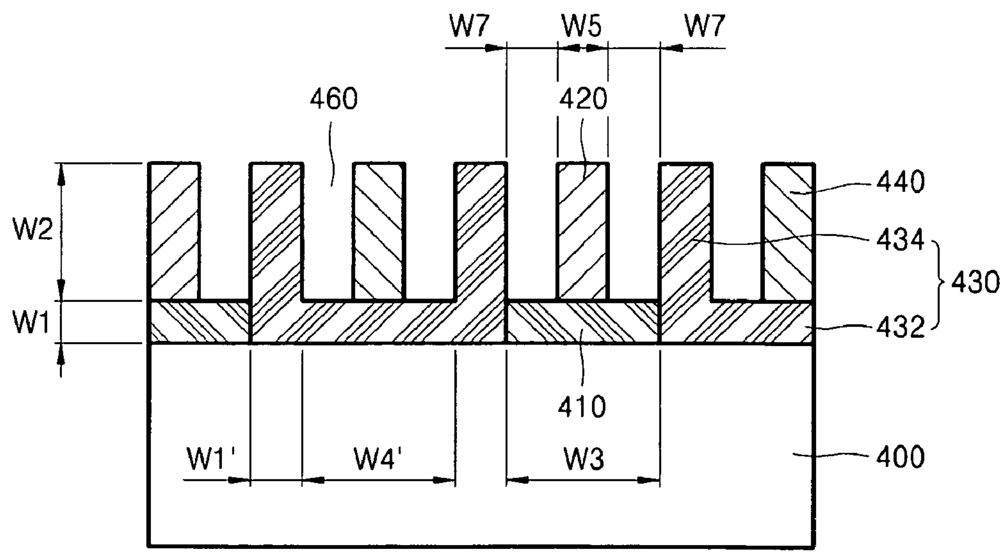
Figure 4E:
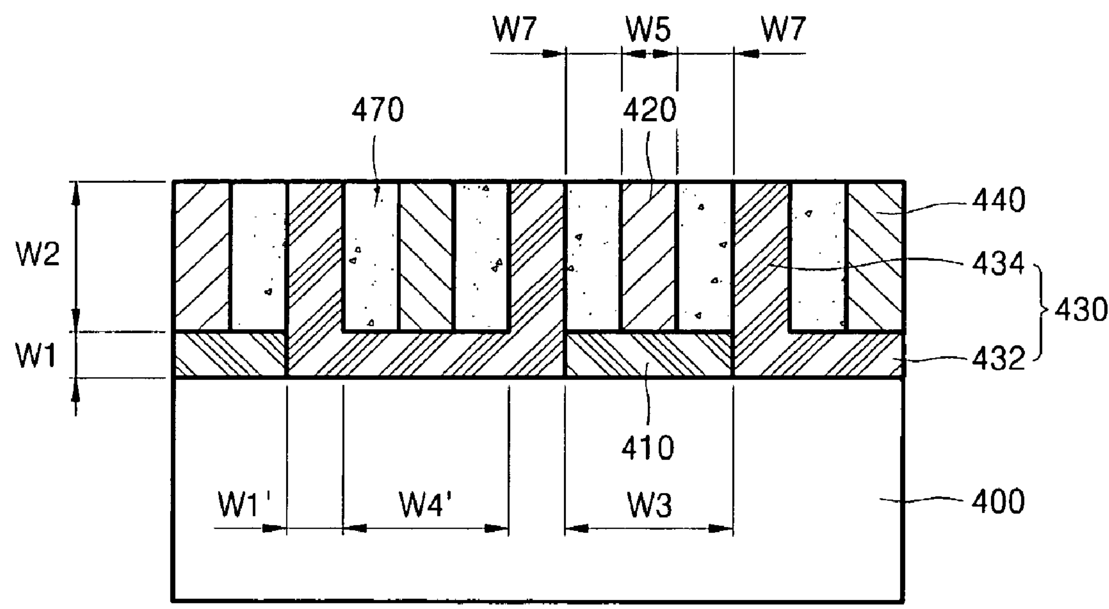

As shown in FIGS. 4C and 4D, by using the mask patterns 450 and/or the spacer patterns 434 as an etching mask, recesses 460 may be formed by removing exposed portions of the first insulating layer patterns 420 and/or the second insulating layer patterns 440. An etching process with a lower etch selectivity with respect to the spacer patterns 434 than to the first insulating layer patterns 420 and the second insulating layer patterns 440 may be used. A width W7 of the recesses 460 may be the width of the conductive patterns 470 (FIG. 4E).

As shown in FIG. 4E, conductive patterns 470 may be formed by filling a conductive material in the recesses 460. The conductive patterns 470 may be formed by substantially filling the recessed 460 with a conductive layer (not shown) and partially removing the conductive layer such that the first insulating layer pattern 420, the spacer patterns 434, and/or the second insulating layer patterns 440 may be exposed. The conductive layer may be formed of a conductive material including, for example, copper (Cu), tungsten (W), aluminum (Al), and/or another suitable material. The conductive patterns 470 may be formed using a planarization process such as a CMP process, for example.

Example embodiments may include fine patterns that have improved resolution. By using a photolithography process in which pitches including a sum of line patterns and spaces may be substantially identical, fine pitches that may be integrated by at least two times may be formed, and an example embodiment integrated semiconductor device having increased resolution may be manufactured.

A ratio of the width of lines in a fine pattern to the width of spaces in the fine pattern may be adjusted. That is, because the width of spaces may be formed smaller than the width of lines, pitches can be minimized while maintaining substantially the same width of line patterns in semiconductor devices, such as image sensors having several portions exposed to an external light source, for example. Higher performance optoelectronic devices having uniform electric characteristics and improved optical characteristics may be manufactured.

In particular, because widths of adjacent line patterns may be formed differently, if line patterns having various widths are used, such as in the case of non-memory semiconductor devices, for example each of the required line patterns can be formed with precision. Accordingly, wiring lines can be arranged without limitations of conventional photolithography processes for designing semiconductor devices, and design margins are extended accordingly, thereby enabling the manufacture of high performance and highly integrated semiconductor devices.

While example embodiments have been particularly shown and described, it will be understood by one of ordinary skill in the art that various changes in form and details may be made therein without departing from the spirit and scope of the present disclosure as defined by the following claims.

What is claimed is:

1. A method of forming fine patterns of a semiconductor device, the method comprising:

forming a first insulating layer on a substrate;

removing a portion of the first insulating layer so as to form a first insulating layer pattern and an opening portion;

forming a spacer pattern on the sides of the first insulating layer pattern on the substrate;

forming a second insulating layer covering the first insulating layer pattern and the spacer pattern and filling the opening portion;

removing a portion of the second insulating layer so as to expose a top surface of the first insulating layer pattern and a top surface of the spacer pattern so as to form a second insulating layer pattern, the first and the second insulating layer patterns having approximately equal thickness;

exposing sides of the spacer pattern by removing a portion of the first and the second insulating layer patterns so as to form a pair of recesses; and filling the pair of recesses with a conductive material.

2. The method of claim 1, wherein forming the spacer pattern includes, forming a buffer layer on the substrate, and removing a portion of the buffer layer such that the spacer pattern remains at only the side of the first insulating layer pattern.

3. The method of claim 1, wherein forming the pair of recesses includes, forming a mask pattern exposing the spacer pattern and a portion of the first and the second insulating layer patterns adjacent to the sides of the spacer pattern, and etching the first and the second insulating layer patterns using the mask pattern and the spacer pattern as an etching mask.

4. The method of claim 1, wherein filling the pair of recesses includes, forming a conductive layer on the spacer pattern and the first and the second insulating layer patterns so as to fill the pair of recesses, and removing a portion of the conductive layer so as to expose the spacer pattern and the first and the second insulating layer patterns.

5. The method of claim 4, wherein removing the conductive layer is performed using a chemical mechanical polishing (CMP) process, and wherein the conductive layer is polished to remove a portion of the spacer pattern and an upper portion of the insulating layer pattern.

6. The method of claim 1, wherein the conductive material includes a material selected from the group consisting of Copper, Tungsten, and Aluminum.

7. The method of claim 1, wherein the first and the second insulating layer pattern includes an oxide.

8. The method of claim 1, wherein the spacer pattern includes a nitride.

9. The method of claim 2, wherein each of the recesses has about equal width, and wherein a width of the first insulating layer pattern is approximately a sum of a width of the buffer layer and twice the width of each of the recesses, and wherein a width of the opening portion is approximately a sum of the width of each recess and twice the thickness of the buffer layer.

10. The method of claim 2, wherein each of the recesses has about equal width, and wherein a width of the first insulating layer pattern is about three times a width of the buffer layer, and wherein a width of the opening portion is about five times the width of the buffer layer, and wherein the width of each recess is approximately equal to the width of the buffer layer.

11. A method of forming fine patterns of a semiconductor device, the method comprising:

forming a first buffer layer on a substrate;

forming a first insulating layer on the first buffer layer;

removing at least one portion of the first insulating layer and the first buffer layer so as to form a first insulating layer pattern, a first buffer layer pattern, and an opening portion;

forming a second buffer layer on the substrate, the first insulating layer pattern, and the first buffer layer pattern;

forming a second insulating layer on the second buffer layer, the second insulating layer having at least a portion at a thickness approximately equal to a thickness of the second buffer layer;

removing at least one portion of the second insulating layer and the second buffer layer so as to expose a top surface of the first insulating layer pattern and so as to form a second insulating layer pattern and a spacer pattern, the spacer pattern being a portion of the second buffer layer between the first insulating layer pattern and the second insulating layer pattern;

removing portions of the first insulating layer pattern and the second insulating layer pattern so as to form a pair of recesses exposing the sides of the spacer pattern; and filling the pair of recesses with a conductive material.

12. The method of claim 11, wherein the second buffer layer and the first buffer layer have an approximately equal thickness.

13. The method of claim 11, wherein removing portions of the first insulating pattern includes, forming a mask pattern partially exposing the spacer pattern and the portions of the first insulating layer pattern and the second insulating layer pattern, the portions being adjacent to the sides of the spacer pattern, and etching the first insulating layer pattern and the second insulating layer pattern using the mask pattern and the spacer pattern as an etching mask.

14. The method of claim 11, wherein the filling the pair of recesses includes, forming a conductive layer on the spacer pattern, the first insulating layer pattern, and the second insulating layer pattern so as to fill the pair of recesses, and removing portions of the conductive layer so as to expose the spacer pattern, the first insulating layer pattern, and the second insulating layer pattern.

15. The method of claim 11, wherein the conductive material includes a material selected from the group consisting of Copper, Tungsten, and Aluminum.

16. The method of claim 11, wherein the first insulating layer and the second insulating layer include an oxide.

17. The method of claim 11, wherein the first buffer layer and the second buffer layer include a nitride.

18. The method of claim 11, wherein each of the recesses has about equal width, a width of the first insulating layer pattern is approximately a sum of a width of the second buffer layer and twice the width of each of the recesses, and wherein a width of the opening portion is approximately a sum of the width of each recess and twice the thickness of the second buffer layer.

19. The method of claim 11, each of the recesses has about equal width, and wherein a width of the first insulating layer pattern is about three times a width of the second buffer layer, and wherein a width of the opening portion is about five times the width of the second buffer layer, and wherein the width of each recess is approximately equal to the width of the second buffer layer.

* * * * *